US010032882B2

(12) United States Patent
Koga

(10) Patent No.: US 10,032,882 B2
(45) Date of Patent: Jul. 24, 2018

(54) SILICON CARBIDE SEMICONDUCTOR DEVICE AND METHOD OF MANUFACTURING SILICON CARBIDE SEMICONDUCTOR DEVICE

(71) Applicant: Fuji Electric Co., Ltd., Kanagawa (JP)

(72) Inventor: Takeharu Koga, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/293,222

(22) Filed: Oct. 13, 2016

(65) Prior Publication Data

US 2017/0141206 A1    May 18, 2017

(30) Foreign Application Priority Data

Nov. 16, 2015    (JP) .................................. 2015-223767

(51) Int. Cl.
*H01L 29/66* (2006.01)
*H01L 29/32* (2006.01)
(Continued)

(52) U.S. Cl.
CPC ...... *H01L 29/66068* (2013.01); *H01L 21/046* (2013.01); *H01L 21/0445* (2013.01);
(Continued)

(58) Field of Classification Search
CPC .......... H01L 29/66068; H01L 29/1608; H01L 29/32; H01L 29/7802; H01L 29/7813; H01L 21/0445; H01L 21/046
(Continued)

(56) References Cited

U.S. PATENT DOCUMENTS

| 2006/0102870 A1* | 5/2006 | Viens | ................ | H01L 27/14652 |
| | | | | 252/62.3 R |
| 2014/0145209 A1* | 5/2014 | Kumagai | .......... | H01L 29/41766 |
| | | | | 257/77 |

(Continued)

FOREIGN PATENT DOCUMENTS

| JP | 2013-232562 A | 11/2013 |
| JP | 2014-131008 A | 7/2014 |

OTHER PUBLICATIONS

Zhang et al., "Electrically active defects in n-type 4H-silicon carbide grown in a vertical hot-wall reactor", Jounal Applied Physics, vol. 93, No. 8, 2003, pp. 4708-4714.*

*Primary Examiner* — Cuong Q Nguyen
*Assistant Examiner* — Tong-Ho Kim
(74) *Attorney, Agent, or Firm* — Chen Yoshimura LLP

(57) ABSTRACT

A recombination center is formed within the bandgap of at least a silicon carbide material used to form an $n^-$ drift layer in a SiC-MOSFET. This recombination center is an impurity level formed by doping the $n^-$ drift layer with boron (B) or the like and/or a defect level constituted by defects formed by irradiating the $n^-$ drift layer with an electron beam. Due to the presence of this recombination center, the effective bandgap $E_{g1}$ of the silicon carbide material of the $n^-$ drift layer is set to be narrower than the original bandgap $E_{g0}$ and less than the valence band offset $\Delta E_{V0}$ of a silicon carbide/insulating film interface. As a result, the photon energy created by recombination of electrons and holes while a body diode of the SiC-MOSFET is conducting current in a forward direction is less than the valence band offset $\Delta E_{V0}$ of the silicon carbide/insulating film interface.

17 Claims, 6 Drawing Sheets

(51) Int. Cl.
  *H01L 29/78* (2006.01)
  *H01L 21/04* (2006.01)
  *H01L 29/16* (2006.01)

(52) U.S. Cl.
  CPC .......... *H01L 29/1608* (2013.01); *H01L 29/32* (2013.01); *H01L 29/7802* (2013.01); *H01L 29/7813* (2013.01)

(58) Field of Classification Search
  USPC .................................................. 257/77, 76
  See application file for complete search history.

(56) References Cited

U.S. PATENT DOCUMENTS

2014/0302621 A1* 10/2014 Niimura ................ H01L 21/263
  438/14
2015/0108501 A1* 4/2015 Iwamuro ............. H01L 29/1608
  257/77

\* cited by examiner

SILICON CARBIDE SEMICONDUCTOR DEVICE AND METHOD OF MANUFACTURING SILICON CARBIDE SEMICONDUCTOR DEVICE

BACKGROUND OF THE INVENTION

Technical Field

The present invention relates to a silicon carbide semiconductor device and a method of manufacturing the silicon carbide semiconductor device.

Background Art

Silicon carbide (SiC) has low on-resistance and excellent high speed and high temperature performance and has therefore conventionally attracted attention as a next-generation power semiconductor material. As further background, silicon carbide exhibits a critical electric field strength of at least an order of magnitude greater than that of silicon (Si), makes it possible to maintain sufficient breakdown voltage even at high impurity concentrations, and makes it possible to achieve a much more dramatic reduction in on-resistance than with silicon. Silicon carbide is a material with exceptional chemical stability that also offers advantages such as having a wide bandgap of 3.26 eV and being suitable for use as a semiconductor in an extremely stable manner even at high temperatures. Silicon carbide is therefore theoretically capable of exceeding the material limits of silicon (the so-called silicon limit) and shows enormous potential for use in power semiconductor device applications.

Metal-oxide-semiconductor field-effect transistor (MOSFET) structures have been disclosed as semiconductor devices that use silicon carbide (hereinafter, "silicon carbide semiconductor devices") (see Patent Document 1 (FIGS. 1 and 9) and Patent Document 2 (FIG. 1), for example). In Patent Documents 1 and 2, a semiconductor substrate (hereinafter, a "silicon carbide substrate") formed by epitaxially growing a silicon carbide layer on top of an $n^+$ supporting substrate made of silicon carbide (hereinafter, an "$n^+$ silicon carbide substrate") is used to form a MOSFET. More specifically, in Patent Document 1, an $n^-$ drift layer made of silicon carbide is layered on top of an $n^+$ silicon carbide substrate, and in Patent Document 2, an $n^-$ drift layer and a p-type base layer made of silicon carbide are layered in order on top of an $n^+$ silicon carbide substrate.

Next, a planar-gate vertical MOSFET will be described as an example of a conventional silicon carbide semiconductor device. FIG. 4A is a cross-sectional view illustrating the state of a conventional semiconductor device while a body diode is conducting current in a forward direction. FIG. 4A illustrates a state in which a positive voltage Vsd relative to a drain electrode 111 is applied to a source electrode 109, a p-n junction 112 between p-type base regions 103 and an $n^-$ drift layer 102 is forward-biased such that a body diode 113 conducts current in a forward direction, and a gate electrode 107 is negative-biased (that is, a gate voltage Vgs<0V). The conventional silicon carbide semiconductor device illustrated in FIG. 4A includes a typical MOS gate structure formed on the (0001) plane (the so-called Si-face; here, the surface on the $n^-$ drift layer 102 side) side of a silicon carbide substrate (a semiconductor chip) 110, for example.

The silicon carbide substrate 110 is a semiconductor substrate formed by layering the $n^-$ drift layer 102 (which is made of silicon carbide) on the Si-face of an $n^+$ supporting substrate made of silicon carbide (hereinafter, an "$n^+$ silicon carbide substrate") 101. The MOS gate structure includes p-type base regions 103 (103a and 103b), $n^+$ source regions 104, $p^+$ contact regions 105, a gate insulating film 106, and a gate electrode 107. The body diode 113 (which is a parasitic p-n diode) is formed at the p-n junction 112 between the p-type base regions 103 and the $n^-$ drift layer 102. A source electrode 109 contacts the $n^+$ source regions 104 and the $p^+$ contact regions 105 and is thereby electrically connected to the p-type base regions 103. The reference character 108 is an interlayer insulating film. The drain electrode 111 is formed on the (000-1) plane (the so-called C-face; here, the C-face of the $n^+$ silicon carbide substrate 101) of the silicon carbide substrate 110.

This type of silicon carbide MOSFET (hereinafter, "SiC-MOSFET") shows good potential for use as a low on-resistance, high switching speed switching device in power converters such as motor control inverters and uninterruptible power supplies (UPS). In an inverter, bridge-connected SiC-MOSFETs are switched ON and OFF to control the current (load current) flowing through an inductive load such as a motor. To prevent the SiC-MOSFETs from being damaged by load current created by the counter-electromotive force (surge) of the inductive load, protective diodes (free wheel diodes) for diverting the load current created by the counter-electromotive force of the inductive load are required.

Usually, the integrated body diodes 113 in the SiC-MOSFETs are used as the protective diodes (free wheel diodes) (a diode rectification scheme). However, because silicon carbide is a semiconductor that has a wider bandgap than silicon (hereinafter, a "wide-bandgap semiconductor"), the body diodes 113 have a high threshold voltage (that is, the forward voltage Vf at which a forward current If begins to flow), and the resulting power loss is large. Therefore, a synchronous rectification scheme is sometimes used. In this scheme, the bridge-connected SiC-MOSFETs are alternately switched ON and OFF to achieve rectification, and the SiC-MOSFETs are switched ON while the load current is being diverted in order to decrease the forward voltage Vf of the body diodes 113. Moreover, schemes in which a Schottky barrier diode (SBD) is connected in parallel to the body diode 113 to divert the load current and reduce the forward voltage Vf of the body diode 113 have also been proposed.

RELATED ART DOCUMENTS

Patent Documents

Patent Document 1: Japanese Patent Application Laid-Open Publication No. 2014-131008
Patent Document 2: Japanese Patent Application Laid-Open Publication No. 2013-232562

SUMMARY OF THE INVENTION

However, with conventional SiC-MOSFETs, even if a synchronous rectification scheme is implemented or an SBD is connected in parallel to the body diode 113 as described above, the forward current If of the body diode 113 cannot be reduced to zero. Meanwhile, if a forward current If is passed through the body diode 113 with a negative bias (a gate voltage Vgs=-10V, for example) applied to the gate electrode 107 while the SiC-MOSFET is OFF in order to achieve a sufficient noise margin (that is, an operational margin relative to a noise voltage) in the SiC-MOSFET, the gate threshold voltage Vth may fluctuate. One probable reason why the gate threshold voltage Vth fluctuates when current is flowing in the forward direction through the body diode 113 is as follows.

FIG. 4B is a characteristic diagram illustrating a band structure at the interface between the semiconductor and the insulating film in FIG. 4A (that is, while the body diode 113 is conducting current in the forward direction and the gate voltage Vgs<0V). FIG. 4B illustrates the band diagram of energy bands formed at an interface 110a between a 4H—SiC (silicon carbide with a four-layer hexagonal crystal structure) material used to form the n⁻ drift layer 102 and the p-type base region 103b and a silicon dioxide ($SiO_2$) material used to form the gate insulating film 106. When the forward current If flows through the body diode 113, electrons 121 supplied to the n⁻ drift layer 102 from the drain side and holes 122 supplied to the n⁻ drift layer 102 from the source side recombine between the energy bands (that is, between the conduction band and the valence band) of the silicon carbide material of the n⁻ drift layer 102. In a wide-bandgap semiconductor such as silicon carbide, when this recombination occurs, the difference in energy (photon energy) $h_\nu$ between the electrons 121 and the holes 122 is released (emitted) as photons.

Here, a negative bias is applied to the gate electrode 107, and as a result, an accumulation layer 123 of holes 122 is formed in the surface layer of the p-type base regions 103. Moreover, if the photon energy $h_\nu$ of the photons is greater than or equal to the valence band offset $\Delta E_{V0}$ of the silicon carbide/insulating film interface (that is, if $h_\nu \geq \Delta E_{V0}$), the photon energy $h_\nu$ of the photons is applied to the holes 122 in the accumulation layer 123. Holes 122a in the accumulation layer 123 that absorbs the photon energy $h_\nu$ of the photons are photo-excited to above the valence band offset $\Delta E_{V0}$ of the silicon carbide/insulating film interface and injected into the gate insulating film 106, thereby causing the gate threshold voltage Vth to fluctuate (see FIG. 4B). Note that here, "the valence band offset $\Delta E_{V0}$ of the silicon carbide/insulating film interface" refers to the energy gap between the valence bands of the silicon carbide material of the n⁻ drift layer 102 and the insulating film material of the gate insulating film 106.

More specifically, 4H—SiC (silicon carbide with a four-layer hexagonal crystal structure), for example, has a surface binding energy $E_P$ of 8.78 eV and a bandgap $E_{g0}$ of 3.26 eV. Here, $E_{C0}$ is the energy level at the bottom of a conduction band, and $E_{V0}$ is the energy level at the top of a valence band. The conduction band offset $\Delta E_{C0}$ of the 4H—SiC/silicon dioxide ($SiO_2$) interface (that is, the energy gap between the conduction bands of 4H—SiC and $SiO_2$) is 2.7 eV. Moreover, the valence band offset $\Delta E_{V0}$ of the 4H—SiC/$SiO_2$ interface is 2.82 eV. Therefore, when photons are emitted due to recombination of the electrons 121 and the holes 122 between the energy bands of the silicon carbide, the gate threshold voltage Vth fluctuates, and it is difficult to ensure long-term reliability of the SiC-MOSFET.

The present invention was made to solve such problems in the conventional technologies described above and aims to provide a silicon carbide semiconductor device and a method of manufacturing the silicon carbide semiconductor device that make it possible to achieve low on-resistance as well as prevent fluctuations in the gate threshold voltage. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a silicon carbide semiconductor device, including: a semiconductor substrate of a first conductivity type made of silicon carbide; a semiconductor layer of the first conductivity type that is formed on a frontside surface of the semiconductor substrate and that is made of silicon carbide of a lower impurity concentration than the semiconductor substrate; a first semiconductor region of a second conductivity type that is selectively formed in the semiconductor layer on a side opposite to the semiconductor substrate; a second semiconductor region of the first conductivity type that is selectively formed in the first semiconductor region; a gate insulating film formed contacting a portion of the first semiconductor region arranged between the second semiconductor region and the semiconductor layer; a gate electrode formed on the gate insulating film on a side opposite to the first semiconductor region; a first electrode contacting the first semiconductor region and the second semiconductor region; and a second electrode formed on a backside surface of the semiconductor substrate, wherein the semiconductor layer has at least one energy level as a recombination center, and wherein an effective bandgap, created by the recombination center, of the silicon carbide of the semiconductor layer is narrower than an energy level difference between a valence band edge of the silicon carbide of the semiconductor layer and a valence band edge of an insulating film material of the gate insulating film.

Moreover, in one aspect, in the silicon carbide semiconductor device according to the present invention as described above, the silicon carbide of the semiconductor layer may have, at a level higher than the valence band edge of the silicon carbide of the semiconductor layer, a first energy level as the recombination center. The first energy level may constitute an effective valence band edge of the silicon carbide of the semiconductor layer.

Furthermore, in one aspect, in the silicon carbide semiconductor device according to the present invention as described above, the first energy level may be an impurity level of boron introduced into the semiconductor layer.

In addition, in one aspect, in the silicon carbide semiconductor device according to the present invention as described above, the silicon carbide of the semiconductor layer may have, at a level lower than a conduction band edge of the silicon carbide of the semiconductor layer, a second energy level as the recombination center. The second energy level may constitute an effective conduction band edge of the silicon carbide of the semiconductor layer.

Moreover, in one aspect, in the silicon carbide semiconductor device according to the present invention as described above, the second energy level may be a defect level formed by defects introduced into the semiconductor layer.

Furthermore, in one aspect, in the silicon carbide semiconductor device according to the present invention as described above, the effective bandgap, created by the recombination center, of the silicon carbide of the semiconductor layer may be less than 2.82 eV.

In addition, in one aspect, in the silicon carbide semiconductor device according to the present invention as described above, the silicon carbide semiconductor device may have a planar-gate structure in which the gate insulating film and the gate electrode are formed over the first semiconductor region.

Moreover, in one aspect, in the silicon carbide semiconductor device according to the present invention as described above, the first semiconductor region may be provided in a pair, and a third semiconductor region of the first conductivity type may be formed in a portion of the semiconductor layer sandwiched between the pair of first semiconductor regions and have a higher impurity concentration than the semiconductor layer. Each of the first semiconductor regions may extend further into the third semiconductor region in a portion near the second electrode than in a portion near the first electrode.

Furthermore, in one aspect, in the silicon carbide semiconductor device according to the present invention as described above, an impurity concentration of the first semiconductor region may be higher in a portion near the second electrode side than in a portion near the first electrode side.

In addition, in one aspect, in the silicon carbide semiconductor device according to the present invention as described above, the silicon carbide semiconductor device may have a trench-gate structure in which the gate electrode is formed inside a trench that penetrates the second semiconductor region and the first semiconductor region to reach the semiconductor layer, with the gate insulating film being interposed between the gate electrode and the trench.

In another aspect, the present disclosure provides a method of manufacturing a silicon carbide semiconductor device, including: a first step of forming, on a frontside surface of a semiconductor substrate of a first conductivity type made of silicon carbide, a semiconductor layer of the first conductivity type made of silicon carbide of a lower impurity concentration than the semiconductor substrate; a second step of selectively forming a first semiconductor region of a second conductivity type in the semiconductor layer on a side opposite to the semiconductor substrate; a third step of selectively forming a second semiconductor region of the first conductivity type in the first semiconductor region; a fourth step of forming a gate insulating film contacting a portion of the first semiconductor region arranged between the second semiconductor region and the semiconductor layer; a fifth step of forming a gate electrode on the gate insulating film on a side opposite to the first semiconductor region; a sixth step of forming a first electrode that contacts the first semiconductor region and the second semiconductor region; and a seventh step of forming a second electrode on a backside surface of the semiconductor substrate, wherein at least one energy level is formed as a recombination center in the semiconductor layer, and an effective bandgap, created by the recombination center, of the silicon carbide of the semiconductor layer is made narrower than an energy level difference between a valence band edge of the silicon carbide of the semiconductor layer and a valence band edge of an insulating film material of the gate insulating film.

Moreover, in one aspect, in the method of manufacturing the silicon carbide semiconductor device according to the present invention as described above, in the first step, the semiconductor layer may epitaxially grown. During the epitaxial growth, boron may be introduced into the semiconductor layer in order to form, at a level higher than the valence band edge of the silicon carbide of the semiconductor layer, an impurity level as the recombination center.

Furthermore, in one aspect, the method of manufacturing the silicon carbide semiconductor device according to the present invention as described above may further include, after the sixth step, introducing defects into the semiconductor layer via electron beam irradiation so as to form a defect level as the recombination center at a level lower than a conduction band edge of the silicon carbide of the semiconductor layer.

The invention described above makes it possible to make the photon energy created by recombination of electrons and holes while a body diode is conducting current in a forward direction less than a valence band offset of a silicon carbide/ insulating film interface (that is, less than the energy gap between the valence bands of the silicon carbide material of the semiconductor layer and the insulating film material of the gate insulating film). Therefore, even if a forward current flows through the body diode when the gate electrode is negatively biased, regardless of the magnitude of the negative bias applied to the gate electrode, the holes in the semiconductor layer (where an accumulation layer of holes is formed when the gate electrode is negatively biased) do not overcome the valence band offset of the silicon carbide/ insulating film interface and are therefore not injected into the gate insulating film. As a result, even if the body diode conducts current in the forward direction when the gate electrode is negatively biased, the gate threshold voltage does not decrease due to the recombination of the electrons and the holes. This makes it possible to prevent fluctuations in the gate threshold voltage due to long-term use. In addition, in the invention described above, using silicon carbide makes it possible to achieve a significantly greater reduction in on-resistance than when using silicon.

The silicon carbide semiconductor device and the method of manufacturing the silicon carbide semiconductor device according to the present invention make it possible to achieve low on-resistance as well as improve reliability by preventing fluctuations in the gate threshold voltage.

It is to be understood that both the foregoing general description and the following detailed description are exemplary and explanatory, and are intended to provide further explanation of the invention as claimed.

DETAILED DESCRIPTION OF EMBODIMENTS

Figure 1A:
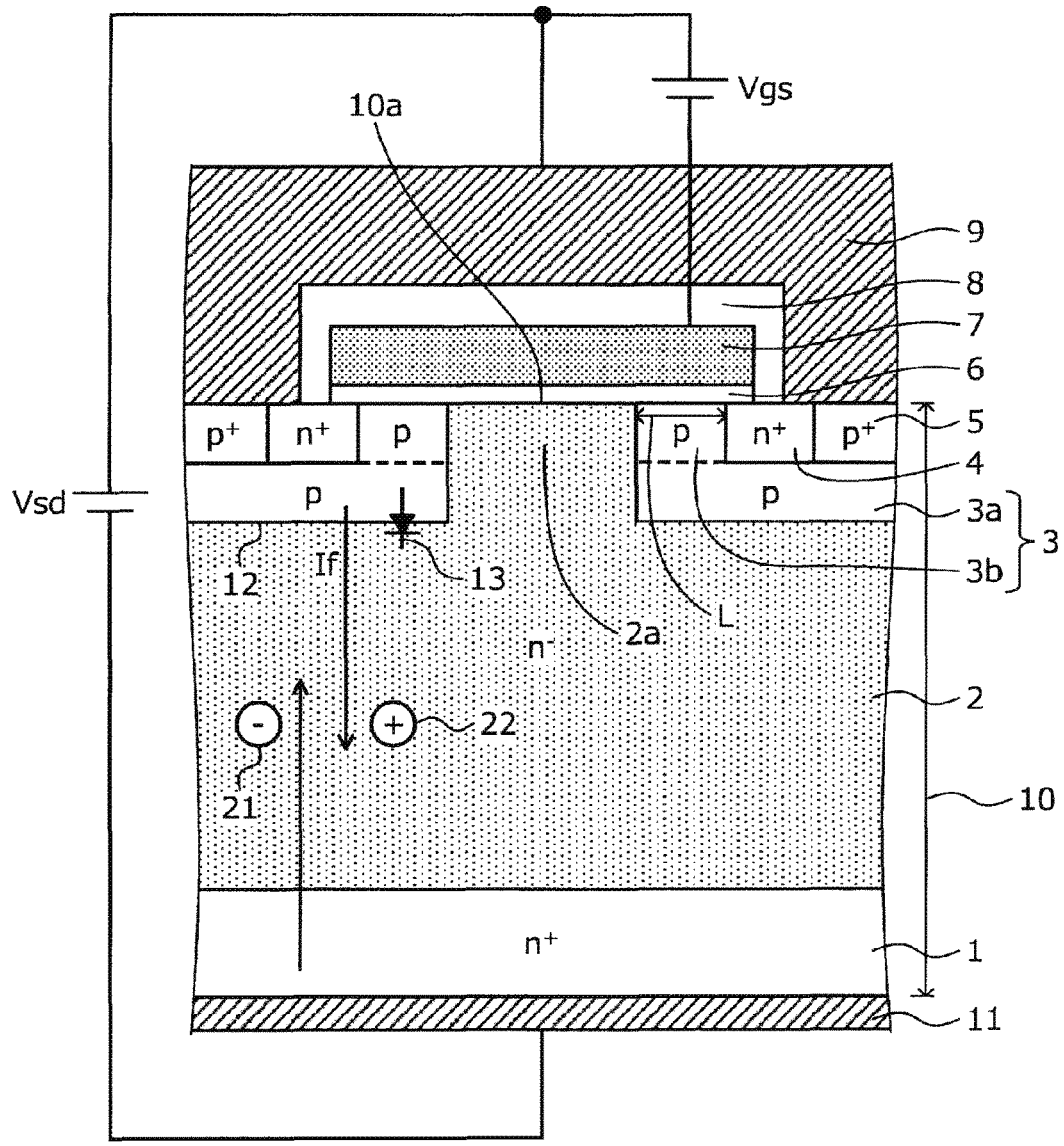
FIG. 1A is a cross-sectional view illustrating the state of a semiconductor device according to Embodiment 1 while a body diode is conducting current in a forward direction.

Preferred embodiments of a silicon carbide semiconductor device and a method of manufacturing the silicon carbide semiconductor device according to the present invention will be described in detail below with reference to figures. In the present specification and the attached drawings, the letters "n" and "p" are used to indicate whether the majority carriers in a layer or region are electrons or holes, respectively. Moreover, the symbols + and − are appended to the letters n and p to indicate layers or regions having a higher or lower density of impurities, respectively, than layers or regions not labeled with the + or − symbols. In the descriptions of the embodiments and figures, the same reference characters are used to indicate components that are the same, and duplicate descriptions of the same components are omitted. Moreover, the following notation is used for Miller indices in the present specification: the symbol − indicates a bar to be applied to the index that follows the − symbol; that is, the symbol − is inserted before an index to indicate that that index is negative.

Embodiment 1

Figure 1B:
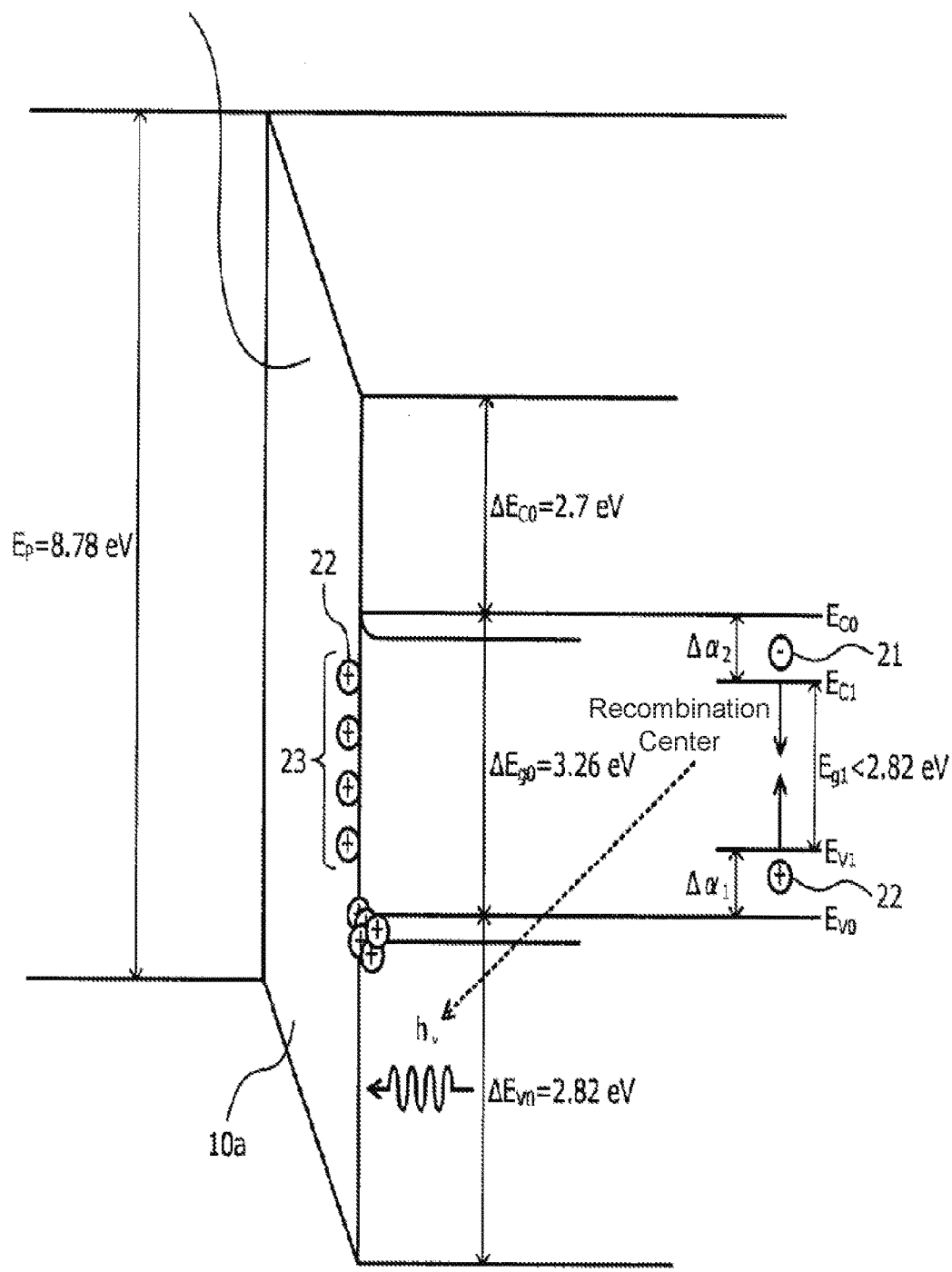
FIG. 1B is a band diagram at an interface between a semiconductor and an insulating film in FIG. 1A.

Next, the structure of a semiconductor device according to Embodiment 1 will be described using a planar-gate MOSFET as an example. FIG. 1A is a cross-sectional view illustrating the state of the semiconductor device according to Embodiment 1 while a body diode is conducting current in a forward direction. FIG. 1B is a band diagram at an interface between a semiconductor and an insulating film in FIG. 1A. FIG. 1A illustrates a state in which a positive voltage Vsd relative to a drain electrode 11 is applied to a source electrode 9, a p-n junction 12 between p-type base regions 3 and a drift region (an n⁻ drift layer 2) is forward-biased such that a body diode 13 conducts current in a forward direction, and a gate electrode 7 is negative-biased (that is, a gate voltage Vgs<0V). FIG. 1B illustrates the band structure of energy bands formed at an interface 10a between a 4H—SiC (silicon carbide with a four-layer hexagonal crystal structure) material used to form the n⁻ drift layer 2 and second p-type base regions 3b and a silicon dioxide ($SiO_2$) material used to form the gate insulating film 6.

The silicon carbide semiconductor device according to Embodiment 1 as illustrated in FIGS. 1A and 1B is an SiC-MOSFET that includes a planar-gate MOS gate structure formed on the frontside surface side (here, the surface on the n⁻ drift layer 2 side) of a silicon carbide substrate (a semiconductor chip) 10. Here, the frontside surface of the silicon carbide substrate 10 is the (0001) plane (the so-called Si-face), for example. The silicon carbide substrate 10 is a semiconductor substrate formed by epitaxially growing the n⁻ drift layer 2 (which is made of silicon carbide) on the frontside surface of an n⁺ supporting substrate made of silicon carbide (an n⁺ silicon carbide substrate) 1. An impurity level (a deep level) constituted by impurities formed by doping the n⁻ drift layer 2 with boron (B) or the like, a defect level (a deep level) constituted by defects formed by irradiating the n⁻ drift layer 2 with an electron beam, or both such levels are formed within the bandgap of the silicon carbide material of the n⁻ drift layer 2.

These deep levels (an impurity level and/or a defect level) are formed relatively close to the center of the bandgap of the silicon carbide material of the n⁻ drift layer 102 and function as a recombination center (a trapping center for electrons 21 and holes 22). Due to the presence of this recombination center, the effective bandgap $E_{g1}$ of the silicon carbide material of the n⁻ drift layer 2 (hereinafter, "effective bandgap") is narrower than the original bandgap $E_{g0}$ of the silicon carbide material of the n⁻ drift layer 2 (that is, $E_{g1}<E_{g0}$). More specifically, the recombination center is formed within the bandgap of the silicon carbide material of the n⁻ drift layer 2 such that the effective bandgap $E_{g1}$ of the silicon carbide material of the n⁻ drift layer 2 is less than the valence band offset $\Delta E_{V0}$ of the silicon carbide/insulating film interface (that is, such that $E_{g1}<\Delta E_{V0}$). Here, "the valence band offset $\Delta E_{V0}$ of the silicon carbide/insulating film interface" refers to the energy gap between the valence bands of the silicon carbide material of the n⁻ drift layer 2 and the insulating film material of the gate insulating film 6.

Assume that a channel (an n-type inversion layer) is formed along the Si-face of the silicon carbide substrate 10, which is made of 4H—SiC (silicon carbide with a four-layer hexagonal crystal structure), for example. In this case, the valence band offset $\Delta E_{V0}$ of the silicon carbide (4H—SiC: n⁻ drift layer 2)/insulating film ($SiO_2$: gate insulating film 6) interface 10a is 2.82 eV, which is the narrowest possible among all combinations of silicon carbide conditions. Therefore, it is preferable that the effective bandgap $E_{g1}$ of the silicon carbide material of the n⁻ drift layer 2 be less than 2.82 eV (that is, $E_{g1}<2.82$ eV). Here, "silicon carbide conditions" refers to the conditions that determine the valence band offset $\Delta E_{V0}$ of the silicon carbide/insulating film interface, which include the crystal structure of the silicon carbide material used to form the n⁻ drift layer 2, the crystal plane along which the channel is formed, and the like. $E_P$ is the surface binding energy, and $\Delta E_{C0}$ is the conduction band offset of the 4H—SiC/SiO₂ interface (that is, the energy gap between the conduction bands of 4H—SiC and $SiO_2$).

More specifically, the recombination center (impurity level) formed by doping with impurities is positioned at an energy level that is higher by an amount $\Delta\alpha_1$ than the original energy level $E_{V0}$ (an intrinsic value) at the top of the valence band of the silicon carbide material of the n⁻ drift layer 2 (the point of highest energy). In other words, the impurity level is the effective energy level $E_{V1}$ at the top of the valence band of the silicon carbide material of the n drift layer 2. In this case, the effective bandgap $E_{g1}$ of the silicon carbide material of the n⁻ drift layer 2 is equal to the energy gap between the effective energy level $E_{V1}$ at the top of the valence band of the silicon carbide material of the n− drift layer 2 and the original energy level $E_{C0}$ at the bottom of the conduction band of the silicon carbide material of the n⁻ drift layer 2. In other words, the effective bandgap $E_{g1}$ of the silicon carbide material of the n⁻ drift layer 2 is narrower by $\Delta\alpha_1$ than the original bandgap $E_{g0}$ of the silicon carbide material of the n⁻ drift layer 2 (that is, $E_{g1}=E_{g0}-\Delta\alpha_1$).

Furthermore, the recombination center (defect level) formed by irradiating with an electron beam is positioned at an energy level that is lower by an amount $\Delta\alpha_2$ than the original energy level $E_{C0}$ (an intrinsic value) at the bottom of the conduction band of the silicon carbide material of the n⁻ drift layer 2 (the point of lowest energy). In other words, the defect level is the effective energy level $E_{C1}$ at the bottom of the conduction band of the silicon carbide material of the n⁻ drift layer 2. In this case, the effective bandgap $E_{g1}$ of the silicon carbide material of the n drift layer 2 is equal to the energy gap between the original energy level $E_{V0}$ at the top of the valence band of the silicon carbide material of the n− drift layer 2 and the effective energy level $E_{C1}$ at the bottom of the conduction band of the silicon carbide material of the n⁻ drift layer 2. In other words, the effective bandgap $E_{g1}$ of the silicon carbide material of the n⁻ drift layer 2 is narrower by $\Delta\alpha_2$ than the original bandgap $E_{g0}$ of the silicon carbide material of the n⁻ drift layer 2 (that is, $E_{g1}=E_{g0}-\Delta\alpha_2$).

FIG. 1B illustrates a case in which both an impurity level and a defect level are formed within the bandgap of the silicon carbide material of the n⁻ drift layer 2. In this case, the effective bandgap $E_{g1}$ of the silicon carbide material of the n⁻ drift layer 2 is equal to the energy gap between the effective energy level $E_{V_1}$ at the top of the valence band of the silicon carbide material of the n– drift layer 2 and the effective energy level $E_{C_1}$ at the bottom of the conduction band of the silicon carbide material of the n⁻ drift layer 2. In other words, FIG. 1B illustrates a state in which the effective bandgap $E_{g1}$ of the silicon carbide material of the n⁻ drift layer 2 is narrower by $\Delta\alpha_1+\Delta\alpha_2$ than the original bandgap $E_{g0}$ of the silicon carbide material of the n⁻ drift layer 2 (that is, $E_{g1}=E_{g0}-(\Delta\alpha_1+\Delta\alpha_2)$). In this way, the effective bandgap $E_{g1}$ of the silicon carbide material of the n⁻ drift layer 2 can be adjusted.

The p-type base regions 3 are selectively formed in the surface layer of the n⁻ drift layer 2 on the substrate frontside surface side. In the p-type base regions 3, the impurity concentration of drain side portions (hereinafter, "first p-type base regions") 3a may be set higher than that of source side portions (hereinafter, "second p-type base regions") 3b. n⁺ source regions 4 and p⁺ contact regions 5 are selectively formed in the p-type base regions 3. The portion of the n⁻ drift layer 2 other than the p-type base regions 3, the n⁺ source regions 4, and the p⁺ contact regions 5 is the drift region. An n-type region (hereinafter, an "n-type surface drift region"; not illustrated in the figure) may be formed in a portion 2a of the n⁻ drift layer 2 that is sandwiched between the adjacent p-type base regions 3 in order to reduce the junction FET (JFET) resistance.

The p-type base regions 3, the n⁺ source regions 4, the p⁺ contact regions 5, and the n-type surface drift region (not illustrated in the figure) are formed in the n⁻ drift layer 2 using ion implantation, for example. As a result, like with the n⁻ drift layer 2, impurities and/or defects that form a recombination center (an impurity level and/or a defect level) are introduced in these regions that are formed in the n⁻ drift layer 2. However, any configuration in which the impurities and/or defects that form a recombination center are introduced in at least the drift region is possible. In FIG. 1A, the hatching indicates that the impurities and defects that form the recombination center are formed only in the drift region of the n⁻ drift layer 2 (this applies to FIGS. 2 and 3 as well). The gate electrode 7 is formed on the surface of the p-type base regions 3, with the gate insulating film 6 interposed therebetween, and contacts the portions of the p-type base regions 3 that are sandwiched between the n⁻ drift layer 2 and the n⁺ source regions 4. The gate insulating film 6 and the gate electrode 7 also extend on top of the portion 2a of the n⁻ drift layer 2 that is sandwiched between the adjacent p-type base regions 3.

Together, the p-type base regions 3, the n⁺ source regions 4, the p⁺ contact regions 5, the gate insulating film 6, and the gate electrode 7 form a MOS gate structure. An interlayer insulating film 8 covers the gate electrode 7. The n⁺ source regions 4 and the p⁺ contact regions 5 are exposed by contact holes that go through the interlayer insulating film 8 in the depth direction. The source electrode 9 contacts the n⁺ source regions 4 and the p⁺ contact regions 5 via the contact holes and is thereby electrically connected to the p-type base regions 3. Moreover, the source electrode 9 is electrically insulated from the gate electrode 7 by the interlayer insulating film 8. The drain electrode 11 contacts the backside surface of the silicon carbide substrate 10 (that is, the rear surface of the n⁺ silicon carbide substrate 1 that functions as a drain layer), which here is the (000-1) plane (the so-called C-face), for example.

Although the dimensions and impurity concentrations used for each portion of the device are not particularly limited, the following values may be used when the SiC-MOSFET according to Embodiment 1 is a device in the 1200V class, for example. The frontside surface of the silicon carbide substrate 10 (which is made of 4H—SiC) is the Si-face, which has an off-angle of approximately 4°. The impurity concentration and thickness of the n⁺ silicon carbide substrate 1 are $2\times10^{18}$/cm³ and 350 µm, respectively. The impurity concentration and thickness of the n⁻ drift layer 2 are $1\times10^{16}$/cm³ and 10 µm, respectively. The impurity concentration and thickness of the first p-type base regions 3a are $1\times10^{18}$/cm³ and 0.3 µm, respectively. The impurity concentration and thickness of the second p-type base regions 3b are $3\times10^{16}$/cm³ and 0.3 µm, respectively. The channel length L (that is, the length of the channel from the n⁺ source regions 4 to the n-type surface drift region) is 0.8 µm. The impurity concentration of the n-type surface drift region is $1\times10^{17}$/cm³. The thickness and width (that is, the width in the same direction as the channel length L) of the n-type surface drift region are 0.7 µm and 1.8 µm, respectively. The impurity concentration and thickness of the n⁺ source regions 4 are $2\times10^{19}$/cm³ and 0.3 µm, respectively. The impurity concentration and thickness of the p⁺ contact regions 5 are $2\times10^{19}$/cm³ and 0.3 µm, respectively. The thickness of the gate insulating film 6 is 50 nm.

Next, the operation of the semiconductor device (SiC-MOSFET) according to Embodiment 1 will be described. When a positive voltage relative to the source electrode 9 is applied to the drain electrode 11 and a voltage less than the threshold voltage is applied to the gate electrode 7 (this case is not illustrated in the figure), the p-n junction 12 between the p-type base regions 3 and the n⁻ drift layer 2 gets reverse-biased, and therefore no current flows between the source and drain. In other words, the SiC-MOSFET remains in the OFF state. Meanwhile, if a voltage greater than or equal to the threshold voltage is applied to the gate electrode 7 (this case is not illustrated in the figure), an n-type inversion layer (channel) is formed in the surface layer of the portions of the second p-type base regions 3b that are directly beneath the gate electrode 7 (on the drain side). In other words, the channel is formed along the frontside surface (Si-face) of the silicon carbide substrate 10. This switches the SiC-MOSFET to the ON state, in which current flows through a path formed between the n⁺ silicon carbide substrate 1, the n⁻ drift layer 2, the inversion layer in the surfaces of the second p-type base regions 3b, and the n⁺ source regions 4.

Furthermore, when the SiC-MOSFET is used to control the current (load current) flowing through an inductive load (such as a motor) of a power converter, for example, the integrated body diode 13 in the SiC-MOSFET can be used as a protective diode (free wheel diode). The body diode 13 is formed by the p-n junction 12 between the p-type base regions 3 and the n⁻ drift layer 2. The protective diode (free wheel diode) diverts load current created by the counter-electromotive force (surge) of the inductive load when the SiC-MOSFET is OFF and thereby prevents any damage to the SiC-MOSFET due to that load current. To use the body diode 13 as a protective diode (free wheel diode), a positive voltage relative to the drain electrode 11 may be applied to the source electrode 9 such that the p-n junction 12 between the p-type base regions 3 and the n⁻ drift layer 2 becomes forward-biased, causing the body diode 13 to conduct current in the forward direction and a forward current If to flow through the body diode 13 (FIG. 1A).

Moreover, applying a negative bias (such as a gate voltage Vgs=−10V) to the gate electrode 7 when the SiC-MOSFET is OFF makes it possible to maintain a sufficient noise margin (that is, an operational margin relative to a noise voltage) in the SiC-MOSFET (FIG. 1A). When a negative bias is applied to the gate electrode 7, an accumulation layer 23 of the holes 22 is formed in the surface layer of the p-type base regions 3. In the present invention, the gate threshold voltage Vth does not fluctuate due to recombination of the electrons 21 and the holes 22 even if a forward current If (such as load current created by the counter-electromotive force of an inductive load, for example) flows through the body diode 113 when the gate electrode 7 is negatively biased. The reason for this is as follows. Assume, for example, that bridge-connected SiC-MOSFETs are switched ON and OFF to control the current (load current) flowing through an inductive load such as a motor, and the integrated body diodes 13 in the SiC-MOSFETs are used as protective diodes (free wheel diodes) for diverting load current created by the counter-electromotive force of the inductive load. When the body diodes 13 are diverting the load current, forward-biasing the p-n junction 12 between the p-type base regions 3 and the n⁻ drift layer 2 results in electrons 21 being supplied to the n⁻ drift layer 2 from the drain side and holes 22 being supplied to the n⁻ drift layer 2 from the source side. In other words, the body diode 13 conducts current in the forward direction, and a forward current If (load current) flows therethrough. When the forward current If flows through the body diode 13, the electrons 21 and the holes 22 recombine between the energy bands (that is, in the bandgap between the conduction band and the valence band) of the silicon carbide material of the n⁻ drift layer 2. In a wide-bandgap semiconductor such as silicon carbide, when this recombination occurs, the difference in energy (photon energy) $h_\nu$ between the electrons 21 and the holes 22 is released (emitted) as photons. The photon energy $h_\nu$ of the photons corresponds to the effective bandgap $E_{g1}$ of the silicon carbide material of the n⁻ drift layer 2 (that is, $h_\nu=E_{g1}$). As described above, the effective bandgap $E_{g1}$ of the silicon carbide material of the n⁻ drift layer 2 is set to be less than the valence band offset $\Delta E_{V0}$ of the silicon carbide/insulating film interface (that is, such that $E_{g1} < \Delta E_{V0}$). Therefore, the photon energy $h_\nu$ of the photons is less than the valence band offset $\Delta E_{V0}$ of the silicon carbide/insulating film interface (that is, $h_\nu < \Delta E_{V0}$). In other words, the photon energy $h_\nu$ of the photons is less than the energy required for the holes 22 in the accumulation layer 23 to overcome the valence band offset $\Delta E_{V0}$ of the silicon carbide/insulating film interface. As a result, regardless of the negative bias applied to the gate electrode 7, the holes 22 in the accumulation layer 23 do not overcome the valence band offset $\Delta E_{V0}$ of the silicon carbide/insulating film interface and therefore are not injected into the gate insulating film 6. This makes it possible to prevent fluctuations in the gate threshold voltage Vth.

Next, a method of manufacturing the semiconductor device according to Embodiment 1 will be described. First, an n⁺ silicon carbide substrate (a semiconductor wafer) 1 made of 4H—SiC, for example, is prepared as a starting substrate. Next, an n⁻ drift layer 2 is epitaxially grown on the frontside surface of the n⁺ supporting substrate 1. While epitaxially growing the n⁻ drift layer 2, impurities that form a recombination center within the bandgap of the silicon carbide material used to form the n⁻ drift layer 2 are introduced into the n⁻ drift layer 2. More specifically, monosilane (SiH₄) gas and dimethylmethane (C₃H₈) gas are used as source gases and hydrogen (H₂) gas is used as a carrier gas while epitaxially growing the n– drift layer 2, for example. Moreover, when using boron for the impurities that form a recombination center in the bandgap of the silicon carbide material of the n⁻ drift layer 2, approximately several ppm of diborane (B₂H₆) gas is added as a dopant gas, for example. The source gases, carrier gas, and dopant gas are input into a reactor (chamber) in which the n⁺ silicon carbide substrate 1 is placed, and the n⁻ drift layer 2 is epitaxially grown in a reduced-pressure atmosphere at a growth temperature of approximately 1450° C. to 1600° C., for example. The boron forms a deep level (an impurity level) at a position 0.47 eV higher than the original energy level $E_{V0}$ at the top of the valence band of the silicon carbide material of the n⁻ drift layer 2. As a result, the effective bandgap $E_{g1}$ of the silicon carbide material of the n⁻ drift layer 2 is 2.79 eV, which is 0.47 eV less than the original bandgap $E_{g0}$ (3.26 eV) of the silicon carbide material of the n⁻ drift layer 2 (that is, $E_{g1}=E_{g0}-\Delta\alpha_1=3.26$ eV$-0.47$ eV). The steps thus far yield a silicon carbide substrate 10, in which the n⁻ drift layer 2 is layered on top of the n⁺ silicon carbide substrate 1.

Next, using photolithography and ion implantation, p-type base regions 3 are selectively formed in the surface layer of the frontside surface of the silicon carbide substrate 10 (that is, the surface on the n⁻ drift layer 2 side). When the impurity concentration of first p-type base regions 3a is to be set higher than the impurity concentration of second p-type base regions 3b, for example, first, p-type impurities are ion-implanted to form the overall p-type base regions 3 (the first and second p-type base regions 3a and 3b) with the impurity concentration of the first p-type base regions 3a. Then, n-type impurities may be ion-implanted in the second p-type base regions 3b to reduce the concentration of p-type impurities in the second p-type base regions 3b. Next, the combined photolithography and ion implantation step is repeated using different ion implantation conditions to selectively form n⁺ source regions 4, p⁺ contact regions 5, and an n-type surface drift region in prescribed formation regions. The order in which the n⁺ source regions 4, the p⁺ contact regions 5, and the n-type surface drift region are formed can be changed in various ways. The n-type surface drift region may also be formed before the p-type base regions 3. Next, using a typical method, a gate insulating film 6, a gate electrode 7, an interlayer insulating film 8, and a source electrode 9 are formed in that order on the frontside surface of the silicon carbide substrate 10. The steps thus far yield a device structure (a MOS gate structure and the source electrode 9) formed on the frontside surface of the silicon carbide substrate 10.

Next, after irradiating the frontside surface side of the silicon carbide substrate 10 with an electron beam, a heat treatment is performed at approximately 300° C. to 400° C., for example, to introduce defects that form a recombination center within the bandgap of the silicon carbide material of the n⁻ drift layer 2 into the n⁻ drift layer 2. During the electron beam irradiation process, the n⁻ drift layer 2 is irradiated with an electron beam that is set to a low acceleration energy of approximately several hundred keV (200 keV, for example) and an exposure dose of approximately $1\times10^{15}/cm^2$ to $1\times10^{18}/cm^2$. This irradiation with a low acceleration energy electron beam only moves the carbon (C) atoms in the silicon carbide, thereby introducing $Z_{1/2}$ centers (defects due to carbon vacancies) into the silicon carbide, which function as lifetime killers. These $Z_{1/2}$ centers form a deep level (a defect level) at a position 0.65 eV lower than the original energy level $E_{C0}$ at the bottom of the conduction band of the silicon carbide material of the n⁻ drift layer 2. As a result, the effective bandgap $E_{g1}$ of the silicon carbide material of the n⁻ drift layer 2 is 2.61 eV, which is 0.65 eV less than the original bandgap $E_{g0}$ (3.26 eV) of the silicon carbide material of the n⁻ drift layer 2 (that is, $E_{g1}=E_{g0}-\Delta\alpha_2=3.26$ eV-0.65 eV). When irradiating with an electron beam that has an acceleration energy of approximately 200 keV, for example, the electron beam goes through the entire n⁻ drift layer 2 (which is only approximately several dozen μm thick; approximately 10 μm thick for a device in the 1200V breakdown voltage class, as described above) in the depth direction. Therefore, the $Z_{1/2}$ centers are introduced uniformly throughout the entire n⁻ drift layer 2 (that is, in all of the regions formed in the n⁻ drift layer 2 as well). Defects may also be introduced into the n⁺ silicon carbide substrate 1 using electron beam irradiation.

In the method of manufacturing the semiconductor device according to Embodiment 1 as described above, any method that makes it possible to make the effective bandgap $E_{g1}$ of the silicon carbide material of the n⁻ drift layer 2 less than the valence band offset $\Delta E_{V0}$ of the silicon carbide/insulating film interface may be used. Therefore, just the impurity level or just the defect level may be formed within the bandgap of the silicon carbide material of the n⁻ drift layer 2, for example. In this case, the effective bandgap $E_{g1}$ of the silicon carbide material of the n⁻ drift layer 2 takes the value from the description of the step of forming the impurity level (epitaxially growing the n⁻ drift layer 2) or the value from the description of the step of forming the defect level (the electron beam irradiation process). Moreover, both the impurity level and the defect level may be formed within the bandgap of the silicon carbide material of the n⁻ drift layer 2 in order to achieve a prescribed effective bandgap $E_{g1}$ in the silicon carbide material of the n⁻ drift layer 2, for example. In this case, the effective bandgap $E_{g1}$ of the silicon carbide material of the n⁻ drift layer 2 is 2.14 eV, which is 1.12 eV less than the original bandgap $E_{g0}$ (3.26 eV) of the silicon carbide material of the n⁻ drift layer 2 (that is, $E_{g1}=E_{g0}-\Delta\alpha_1-\Delta\alpha_2=3.26$ eV-0.47 eV-0.65 eV). Finally, a drain electrode 11 is formed on the backside surface of the silicon carbide substrate 10 (that is, on the n⁺ silicon carbide substrate 1) and the semiconductor wafer is diced into chips, thereby completing the semiconductor device illustrated in FIG. 1A.

In Embodiment 1 as described above, forming at least one deep level that functions as a recombination center within the bandgap of the silicon carbide material of the n⁻ drift layer makes it possible to make the effective bandgap of the silicon carbide material of the n⁻ drift layer narrower than the original bandgap of the silicon carbide material of the n⁻ drift layer. This makes it possible to make the effective bandgap of the silicon carbide material of the n⁻ drift layer narrower than the valence band offset of the silicon carbide/insulating film interface, thereby making it possible to make the photon energy created when electrons and holes recombine while the body diode is conducting current in the forward direction less than the valence band offset of the silicon carbide/insulating film interface. Therefore, even if a forward current (such as a load current created by the counter-electromotive force of an inductive load) flows through the body diode when the gate electrode is negatively biased, regardless of the magnitude of the negative bias applied to the gate electrode, the holes on the surface side of the p-type base regions (where the accumulation layer of holes is formed when the gate electrode is negatively biased) do not overcome the valence band offset of the silicon carbide/insulating film interface and are therefore not injected into the gate insulating film. As a result, even if the body diode conducts current in the forward direction when the gate electrode is negatively biased, the gate threshold voltage does not decrease due to the recombination of the electrons and the holes. This makes it possible to prevent fluctuations in the gate threshold voltage due to long-term use, thereby making it possible to increase the long-term reliability of the semiconductor device. Moreover, Embodiment 1 removes the upper limit on the magnitude of the negative bias that can be applied to the gate electrode. This makes it possible to apply a large negative bias to the gate electrode, thereby making it possible to increase the switching speed. This, in turn, makes it possible to achieve lower switching loss. Furthermore, in Embodiment 1, increasing the magnitude of the negative bias applied to the gate electrode makes it easier to maintain a sufficient noise margin, thereby making it possible to omit components such as capacitors for maintaining the noise margin. In addition, in Embodiment 1, using silicon carbide makes it possible to achieve a significantly greater reduction in on-resistance than when using silicon.

Embodiment 2

Figure 2:
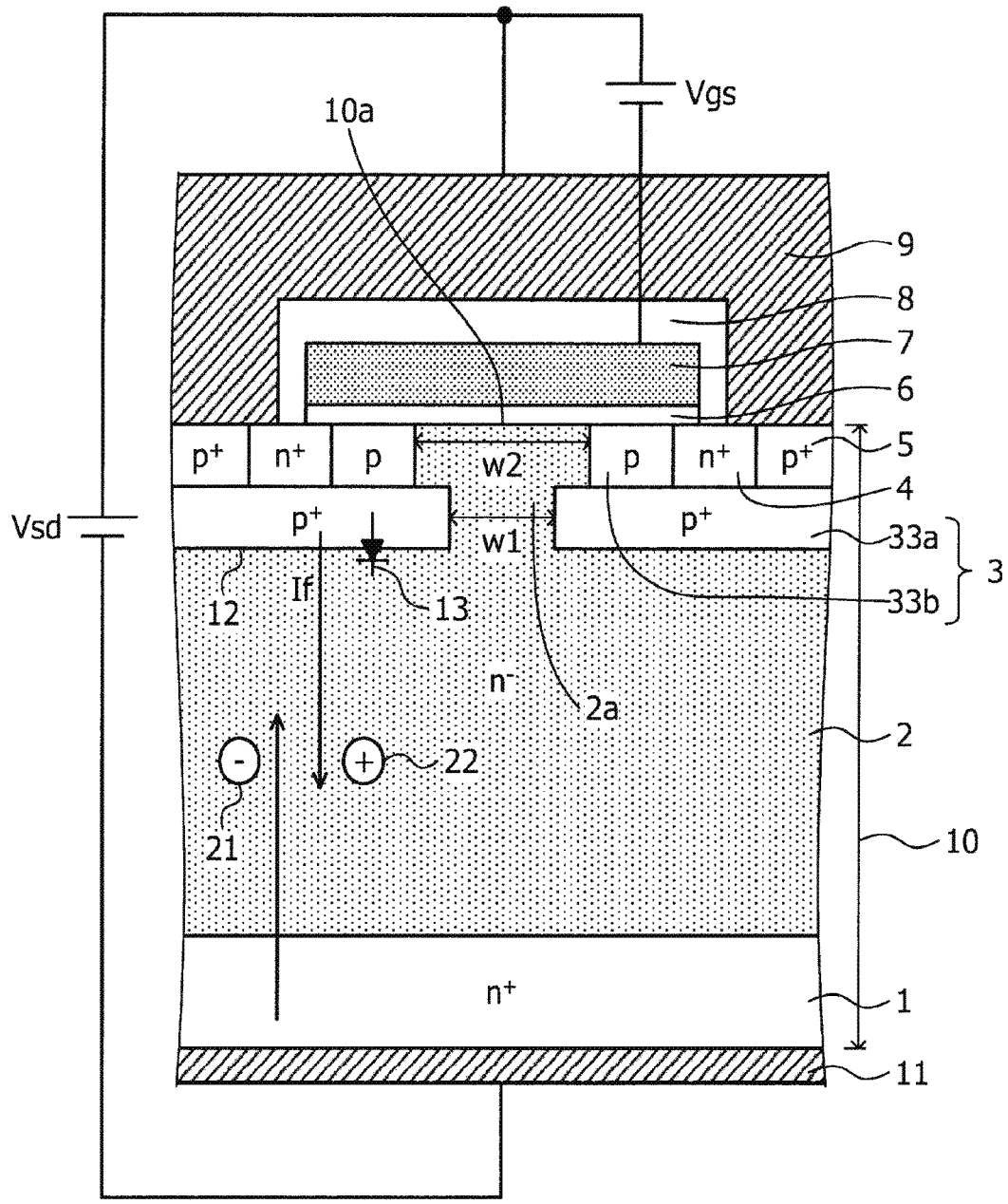
FIG. 2 is a cross-sectional view illustrating the state of a semiconductor device according to Embodiment 2 while a body diode is conducting current in a forward direction.

Next, the structure of a semiconductor device according to Embodiment 2 will be described. FIG. 2 is a cross-sectional view illustrating the state of a semiconductor device according to Embodiment 2 while a body diode is conducting current in a forward direction. The semiconductor device according to Embodiment 2 is different from the semiconductor device according to Embodiment 1 in that first p⁺ base regions (drain side portions of p-type base regions 3) 33a extend further, in a direction parallel to a substrate frontside surface, into a portion 2a of an n⁻ drift layer 2 that is sandwiched between the adjacent p-type base regions 3 than do second p-type base regions (source side portions of the p-type base regions 3) 33b. In other words, directly beneath (on the drain side of) a gate electrode 7, a width w1 between the adjacent first p⁺ base regions 33a (that is, the width in the same direction as a channel length L) is less than a width w2 between the adjacent second p-type base regions 33b (that is, w 1<w2).

The impurity concentration of the first p⁺ base regions 33a is greater than the impurity concentration of the second p-type base regions 33b. Although the dimensions and impurity concentrations used for each portion of the device are not particularly limited, the following values may be used when the SiC-MOSFET according to Embodiment 2 is a device in the 1200V class, for example. The impurity concentrations of the first p⁺ base regions 33a and the second p-type base regions 33b are the same as the impurity concentrations of the first and second p-type base regions 3a and 3b of Embodiment 1, respectively. The thickness of both the first p⁺ base regions 33a and the second p-type base regions 33b is 0.5 μm. The width w1 between the adjacent first p⁺ base regions 33a is 1.6 μm. The width w2 between the adjacent second p-type base regions 33b (that is, the width in the same direction as the channel length L) is greater than 1.6 μm. The configuration of the rest of the portions of the device other than the p-type base regions 3 is the same as in Embodiment 1.

In a method of manufacturing the semiconductor device according to Embodiment 2, the first p⁺ base regions 33a and the second p-type base regions 33b may be formed having different widths therebetween using the method of manufacturing the semiconductor device according to Embodiment 1, for example. For example, when forming the first p⁺ base regions 33a and the second p-type base regions 33b, first, the first p⁺ base regions 33a and the second p-type base regions 33b are formed having different impurity concentrations in the same way as in Embodiment 1. At this stage, the width between the first p+ base regions 33a is the same as the width between the second p-type base regions 33b. Therefore, n-type impurities are ion-implanted to revert portions of the second p-type base regions 33b back to n-type portions, thereby forming an n-type surface drift region of width w2 between the adjacent second p-type base regions 33b, for example. In this way, the width between the second p-type base regions 33b may be adjusted.

Embodiment 2 as described above makes it possible to achieve the same advantageous effects as in Embodiment 1. Moreover, in Embodiment 2, making the width between the adjacent second p-type base regions (the source side portions of the p-type base regions) relatively large makes it possible to reduce the JFET resistance. Furthermore, in Embodiment 2, making the width between the adjacent first p+ base regions (the drain side portions of the p-type base regions) relatively small promotes depletion between those adjacent first p+ base regions when the SiC-MOSFET is OFF, thereby making it possible to reduce the magnitude of the electric field applied to near the boundary between the frontside surface of the silicon carbide substrate and the gate insulating film. This makes it possible to achieve a lower on-resistance as well as reduce the magnitude of the electric field applied to the gate insulating film.

Embodiment 3

Figure 3:
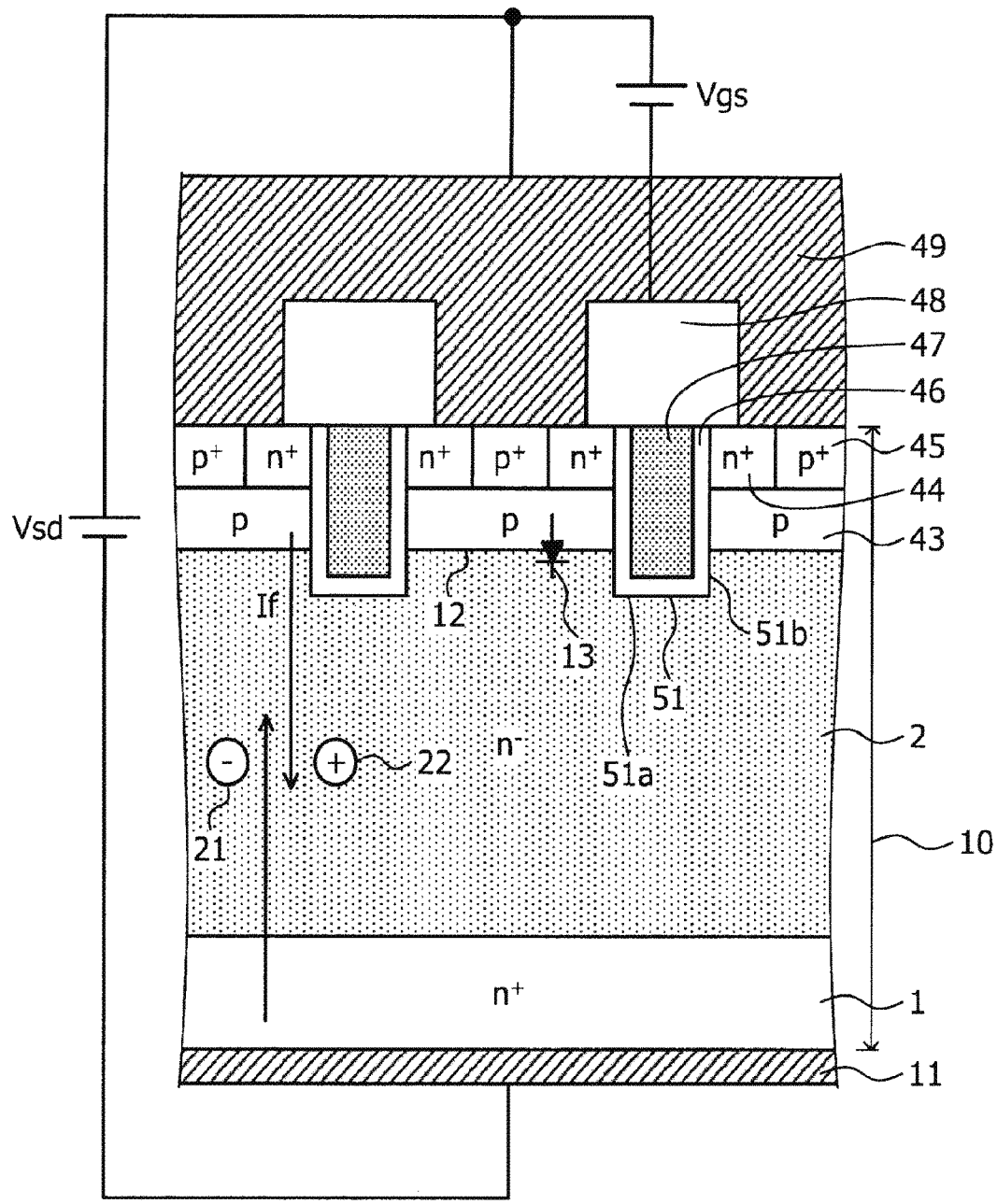
FIG. 3 is a cross-sectional view illustrating the state of a semiconductor device according to Embodiment 3 while a body diode is conducting current in a forward direction.
Figure 4A:
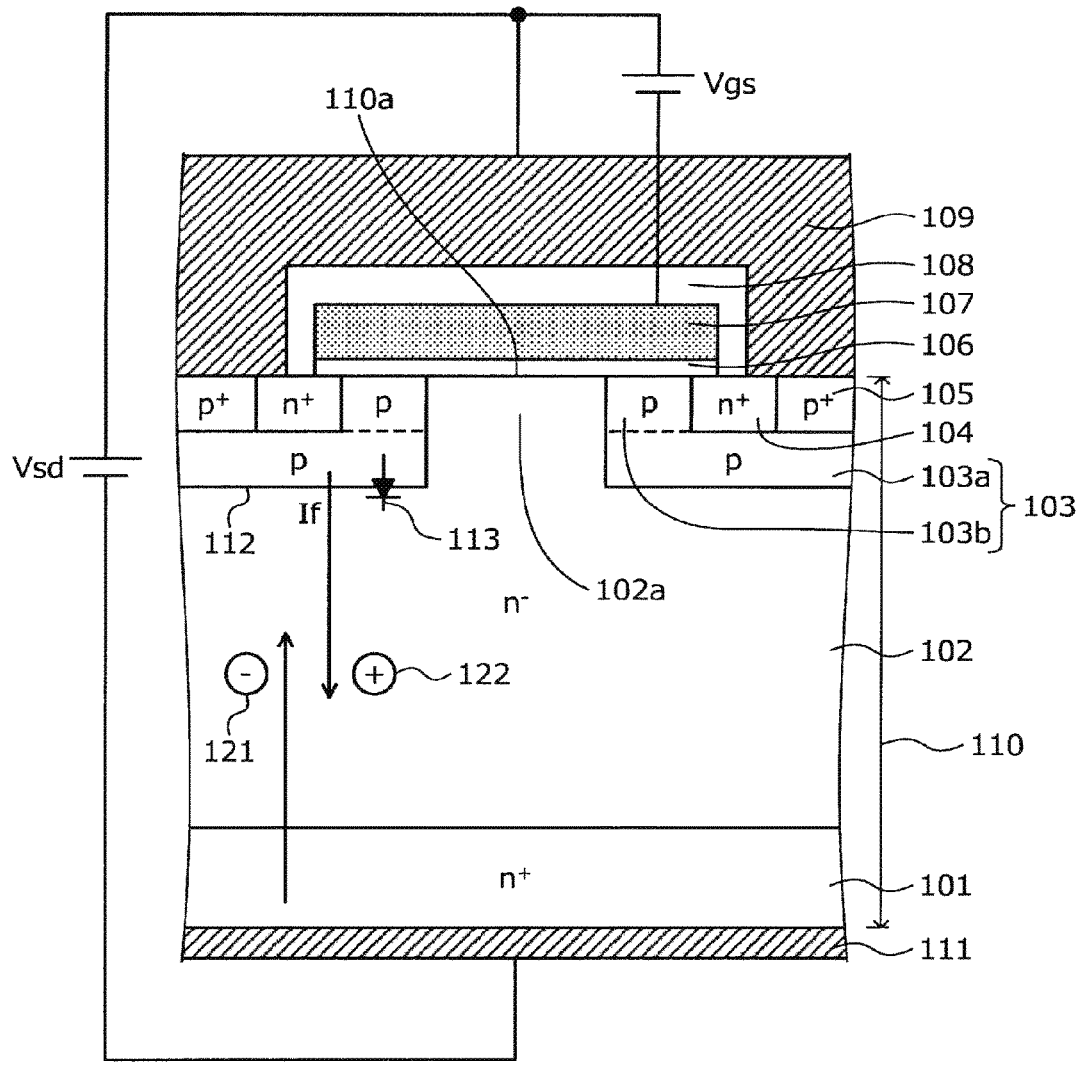
FIG. 4A is a cross-sectional view illustrating the state of a conventional semiconductor device while a body diode is conducting current in a forward direction.
Figure 4B:
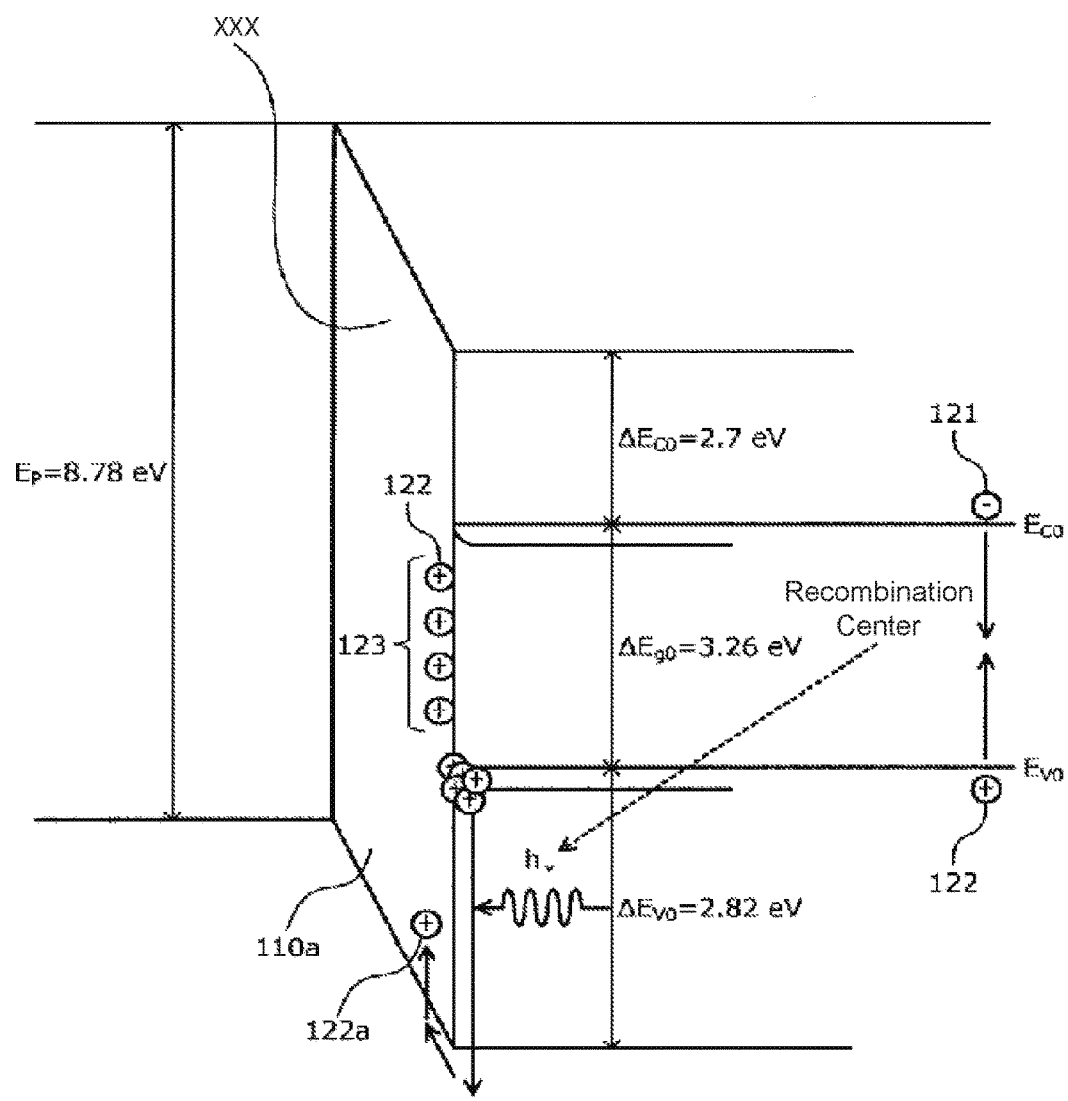
FIG. 4B is a band diagram at an interface between a semiconductor and an insulating film in FIG. 4A.

Next, the structure of a semiconductor device according to Embodiment 3 will be described. FIG. 3 is a cross-sectional view illustrating the state of a semiconductor device according to Embodiment 3 while a body diode is conducting current in a forward direction. The semiconductor device according to Embodiment 3 has a configuration in which the semiconductor device according to Embodiment 1 is applied to a trench-gate MOSFET. In other words, the silicon carbide semiconductor device according to Embodiment 3 as illustrated in FIG. 3 is an SiC-MOSFET that includes trench-gate MOS gate structures formed on the frontside surface side (here, the Si-face) of a silicon carbide substrate (a semiconductor chip) 10.

Like in Embodiment 1, the silicon carbide substrate 10 is a semiconductor substrate formed by epitaxially growing an n− drift layer 2 on the frontside surface of an n+ silicon carbide substrate 1. A recombination center (an impurity level or a defect level, or both) is formed within the bandgap of the silicon carbide material used to form the n− drift layer 2. A p-type base region 43 is formed in the surface layer of the n− drift layer 2 on the substrate frontside surface side. n+ source regions 44 and p+ contact regions 45 are selectively formed in the p-type base region 43. Like in the n− drift layer 2, recombination centers are formed within the bandgap of the silicon carbide material of the p-type base region 43, the n+ source regions 44, and the p+ contact regions 45. The portion of the n− drift layer 2 other than the p-type base region 43, the n+ source regions 44, and the p+ contact regions 45 is a drift region. Trenches 51 are formed going through the n+ source regions 44 and the p+ contact regions 45 and extending into the drift region.

A bottom surface 51a of each trench 51 is a Si-face, and sidewalls 51b of each trench are (1-100) planes, for example. Channels are formed in the portions of the p-type base region 43 running along the sidewalls 51b of the trenches 51 (that is, along the (1-100) planes). A body diode 13 is formed between the adjacent trenches 51 by a p-n junction 12 between the p-type base region 43 and the drift region (the n− drift layer 2). Inside each trench 51, a gate insulating film 46 is formed along the inner walls of the trench 51 (that is, on the bottom surface 51a and the sidewalls 51b), and a gate electrode 47 is formed on the inner side of the gate insulating film 46. A source electrode 49 contacts the n+ source regions 44 and the p+ contact regions 45 and is electrically insulated from the gate electrodes 47 by an interlayer insulating film 48. A drain electrode 11 contacts the rear surface of the silicon carbide substrate 10 (that is, the rear surface (C-face) of the n+ silicon carbide substrate 1).

In Embodiment 3, channels are formed along a different crystal plane as compared to Embodiment 1, and therefore the valence band offset $\Delta E_{V0}$ of the silicon carbide/insulating film interface is different from that in Embodiment 1. For example, when channels are formed along the (11-20) plane, the valence band offset $\Delta E_{V0}$ of the silicon carbide/insulating film interface is midway between that when the channels are formed along the (0001) plane and that when the channels are formed along the (000-1) plane. In this way, even if the channels are formed along a different crystal plane due to using a trench gate structure or the like, the same advantageous effects as in Embodiment 1 can still be achieved as long as the photon energy $h_v$ of the photons created by recombination of electrons 21 and holes 22 is less than the valence band offset $\Delta E_{V0}$ of the silicon carbide/insulating film interface.

In a method of manufacturing the semiconductor device according to Embodiment 3, the trench-gate MOS gate structures may be formed by using the method of manufacturing the semiconductor device according to Embodiment 1 but using any typical method to form trench-gate MOS gate structures instead of the planar-gate MOS gate structure.

Embodiment 3 as described above makes it possible to achieve the same advantageous effects as in Embodiment 1.

Various modifications can be made to the present invention as described above without departing from the spirit of the present invention. For example, the dimensions, impurity concentrations, and the like used for each portion of the device in the embodiments described above can be configured as necessary to meet design requirements or the like. Moreover, in the embodiments described above, the p-type base regions were formed using ion implantation as an example. Alternatively, however, a p-type silicon carbide epitaxial layer (hereinafter, a "p-type base layer") layered on top of the n− drift layer using an epitaxial growth process may be used for the p-type base regions. In this case, a multilayer substrate formed by layering the n− drift layer and the p-type base layer in that order on top of the n+ silicon carbide substrate is used as the silicon carbide substrate. Here, any configuration in which impurities and/or defects that form a recombination center are introduced in at least the n− drift layer out of the various layers of the silicon carbide substrate is possible. However, impurities and/or defects that form a recombination center may also be introduced in the p-type base layer in the same manner as with the n− drift layer. Furthermore, in the embodiments described above, the first conductivity type was n-type and the second conductivity type was p-type. However, the present invention still exhibits all of the same advantageous effects if the first conductivity type is p-type and the second conductivity type is n-type.

INDUSTRIAL APPLICABILITY

As described above, the silicon carbide semiconductor device and the method of manufacturing the silicon carbide semiconductor device according to the present invention are suitable for use in power semiconductor devices used in power converters such as inverters, power supplies for various types of industrial machinery, or the like. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A silicon carbide semiconductor device, comprising:
    a semiconductor substrate of a first conductivity type made of silicon carbide;
    a semiconductor layer of the first conductivity type that is formed on a frontside surface of the semiconductor substrate and that is made of silicon carbide of a lower impurity concentration than the semiconductor substrate;
    a first semiconductor region of a second conductivity type that is selectively formed in the semiconductor layer on a side opposite to the semiconductor substrate;
    a second semiconductor region of the first conductivity type that is selectively formed in the first semiconductor region;
    a gate insulating film formed contacting a portion of the first semiconductor region arranged between the second semiconductor region and the semiconductor layer;
    a gate electrode formed on the gate insulating film on a side opposite to the first semiconductor region;
    a first electrode contacting the first semiconductor region and the second semiconductor region; and
    a second electrode formed on a backside surface of the semiconductor substrate,
    wherein the semiconductor layer has at least one energy level as a recombination center, and
    wherein a concentration of the at least one energy level in the silicon carbide of the semiconductor layer is so large that an effective bandgap of the silicon carbide of the semiconductor layer is made narrower than an intrinsic bandgap of the silicon carbide, and the concentration of the at least one energy level and an insulating film material of the gate insulating film are configured such that said effective bandgap is narrower than an energy level difference between a valence band edge of the silicon carbide of the semiconductor layer and a valence band edge of the insulating film material of the gate insulating film.

2. The silicon carbide semiconductor device according to claim 1,
    wherein the silicon carbide of the semiconductor layer has, at a level higher than the valence band edge of the silicon carbide of the semiconductor layer, a first energy level as the recombination center, and
    wherein the first energy level constitutes an effective valence band edge of the silicon carbide of the semiconductor layer.

3. The silicon carbide semiconductor device according to claim 2, wherein the first energy level is an impurity level of boron introduced into the semiconductor layer.

4. The silicon carbide semiconductor device according to claim 1,
    wherein the silicon carbide of the semiconductor layer has, at a level lower than a conduction band edge of the silicon carbide of the semiconductor layer, a second energy level as the recombination center, and
    wherein the second energy level constitutes an effective conduction band edge of the silicon carbide of the semiconductor layer.

5. The silicon carbide semiconductor device according to claim 4, wherein the second energy level is a defect level formed by defects introduced into the semiconductor layer.

6. The silicon carbide semiconductor device according to claim 1, wherein the effective bandgap, created by the recombination center, of the silicon carbide of the semiconductor layer is less than 2.82 eV.

7. The silicon carbide semiconductor device according to claim 1, wherein the silicon carbide semiconductor device has a planar-gate structure in which the gate insulating film and the gate electrode are formed over the first semiconductor region.

8. The silicon carbide semiconductor device according to claim 7,
    wherein the first semiconductor region is provided in a pair,
    wherein a third semiconductor region of the first conductivity type is formed in a portion of the semiconductor layer sandwiched between said pair of first semiconductor regions and has a higher impurity concentration than the semiconductor layer, and
    wherein each of the first semiconductor regions extends further into the third semiconductor region in a portion near the second electrode than in a portion near the first electrode.

9. The silicon carbide semiconductor device according to claim 7, wherein an impurity concentration of the first semiconductor region is higher in a portion near the second electrode than in a portion near the first electrode.

10. The silicon carbide semiconductor device according to claim 1, wherein the silicon carbide semiconductor device has a trench-gate structure in which the gate electrode is formed inside a trench that penetrates the second semiconductor region and the first semiconductor region to reach the semiconductor layer, with the gate insulating film being interposed between the gate electrode and the trench.

11. A method of manufacturing a silicon carbide semiconductor device, comprising:
    a first step of forming, on a frontside surface of a semiconductor substrate of a first conductivity type made of silicon carbide, a semiconductor layer of the first conductivity type made of silicon carbide of a lower impurity concentration than the semiconductor substrate;
    a second step of selectively forming a first semiconductor region of a second conductivity type in the semiconductor layer on a side opposite to the semiconductor substrate;
    a third step of selectively forming a second semiconductor region of the first conductivity type in the first semiconductor region;
    a fourth step of forming a gate insulating film contacting a portion of the first semiconductor region arranged between the second semiconductor region and the semiconductor layer;
    a fifth step of forming a gate electrode on the gate insulating film on a side opposite to the first semiconductor region;
    a sixth step of forming a first electrode that contacts the first semiconductor region and the second semiconductor region; and a seventh step of forming a second electrode on a backside surface of the semiconductor substrate, wherein at least one energy level is formed as a recombination center in the semiconductor layer, and a concentration of the at least one energy level in the silicon carbide of the semiconductor layer is so large that an effective bandgap of the silicon carbide of the semiconductor layer is made narrower than an intrinsic bandgap of the silicon carbide, and the concentration of the at least one energy level and an insulating film material of the gate insulating film are configured such that said effective bandgap is narrower than an energy level difference between a valence band edge of the silicon carbide of the semiconductor layer and a valence band edge of the insulating film material of the gate insulating film.

12. The method of manufacturing the silicon carbide semiconductor device according to claim 11, wherein in the first step, the semiconductor layer is epitaxially grown, and wherein during the epitaxial growth, boron is introduced into the semiconductor layer in order to form, at a level higher than the valence band edge of the silicon carbide of the semiconductor layer, an impurity level as the recombination center.

13. The method of manufacturing the silicon carbide semiconductor device according to claim 11, further comprising, after the sixth step:

introducing defects into the semiconductor layer via electron beam irradiation so as to form a defect level as the recombination center at a level lower than a conduction band edge of the silicon carbide of the semiconductor layer.

14. A silicon carbide semiconductor device, comprising:

a semiconductor substrate of a first conductivity type made of silicon carbide;

a semiconductor layer of the first conductivity type that is formed on a frontside surface of the semiconductor substrate and that is made of silicon carbide of a lower impurity concentration than the semiconductor substrate;

a first semiconductor region of a second conductivity type that is selectively formed in the semiconductor layer on a side opposite to the semiconductor substrate;

a second semiconductor region of the first conductivity type that is selectively formed in the first semiconductor region;

a gate insulating film formed contacting a portion of the first semiconductor region arranged between the second semiconductor region and the semiconductor layer;

a gate electrode formed on the gate insulating film on a side opposite to the first semiconductor region;

a first electrode contacting the first semiconductor region and the second semiconductor region;

a second electrode formed on a backside surface of the semiconductor substrate, wherein the silicon carbide of the semiconductor layer has, at a level higher than the valence band edge of the silicon carbide of the semiconductor layer, a first energy level as a recombination center at such a concentration that the first energy level constitutes an effective valence band edge of the silicon carbide of the semiconductor layer, and wherein the silicon carbide of the semiconductor layer further has, at a level lower than a conduction band edge of the silicon carbide of the semiconductor layer, a second energy level as a recombination center at such a concentration that the second energy level constitutes an effective conduction band edge of the silicon carbide of the semiconductor layer, and wherein an effective bandgap of the silicon carbide of the semiconductor layer, as defined as a gap between said effective conduction band edge and said effective valence band edge, and an insulating film material of the gate insulating film are configured such that said effective bandgap is narrower than an energy level difference between a valence band edge of the silicon carbide of the semiconductor layer and a valence band edge of the insulating film material of the gate insulating film.

15. The silicon carbide semiconductor device according to claim 14, wherein the first energy level is an impurity level of boron introduced into the semiconductor layer.

16. The silicon carbide semiconductor device according to claim 14, wherein the second energy level is a defect level formed by defects introduced into the semiconductor layer.

17. The silicon carbide semiconductor device according to claim 14, wherein the first energy level is an impurity level of boron introduced into the semiconductor layer, and the second energy level is a defect level formed by defects introduced into the semiconductor layer such that said effective bandgap is 2.14 eV.

* * * * *